United States Patent [19]

Martyniak

[11] 4,263,341
[45] Apr. 21, 1981

[54] PROCESSES OF MAKING TWO-SIDED PRINTED CIRCUIT BOARDS, WITH THROUGH-HOLE CONNECTIONS

[75] Inventor: Gerald J. Martyniak, Indianapolis, Ind.

[73] Assignee: Western Electric Company, Inc., New York, N.Y.

[21] Appl. No.: 970,946

[22] Filed: Dec. 19, 1978

[51] Int. Cl.³ .............................................. B05D 5/12
[52] U.S. Cl. ................................... 427/97; 427/423; 427/404; 427/282; 174/68.5; 264/309
[58] Field of Search ............... 118/504, 301; 427/423, 427/97, 282, 404; 264/134, 135, 267, 269, 309; 174/68.5; 156/644, 668

[56] References Cited

U.S. PATENT DOCUMENTS

| | | | |
|---|---|---|---|
| 2,599,710 | 6/1952 | Hathaway | 427/96 |
| 3,399,649 | 9/1968 | Kidgell et al. | 118/301 |
| 3,620,933 | 11/1971 | Grunwald et al. | 427/97 |
| 3,648,131 | 3/1972 | Stuby | 174/68.5 |
| 3,820,994 | 6/1974 | Lindberg et al. | 156/644 |
| 3,932,143 | 1/1976 | Marshall et al. | 427/423 |
| 3,971,661 | 7/1976 | Lindberg et al. | 427/97 |
| 4,031,268 | 6/1977 | Fairbairn | 427/423 |
| 4,118,523 | 10/1978 | Bingham et al. | 427/97 |
| 4,128,680 | 12/1978 | Heaps et al. | 427/97 |
| 4,191,789 | 3/1980 | Brown et al. | 427/97 |

OTHER PUBLICATIONS

Norwood et al., *Manufacturing Process for Hybrid Microcircuits Containing Vias*, IEEE Transactions on Parts, Hybrids and Packaging, vol. PNP-1, No. 4, pp. 323-335, Dec. 1976.

Cook et al., IBM Tech. Dis. Bul., vol. 20, No. 2, (Jul. 1977).

*Primary Examiner*—Michael F. Esposito
*Assistant Examiner*—Richard Bueker
*Attorney, Agent, or Firm*—J. L. Landis

[57] ABSTRACT

Printed circuits, and techniques and materials for making printed circuits by prior-known metal-spraying techniques, particularly for making two-sided boards with metal through-hole connects. Preferably, a primer coating (40) of a metal such as zinc is sprayed onto one surface of the substrate, through a chrome-plated metal stencil (30), after which a conductive coating (13 or 16), such as copper or nickel, is sprayed onto the zinc coating to form the conductive patterns. Through hole connections (20) are fabricated by forming tapered holes (50), and placing a removable stop member (51) against the narrow end of the hole before spraying the patterns. The first pattern (16) is then sprayed on from the wide end of the hole (50) so that a portion (52) of the material coats the walls of the hole and forms a bridging strip (53) across the narrow end of the hole. After this, the stop (51) is removed, and the other side (14) is sprayed to form a conductive portion (16B) contacting the bridging strip (53) to make the through connect.

10 Claims, 7 Drawing Figures

PROCESSES OF MAKING TWO-SIDED PRINTED CIRCUIT BOARDS, WITH THROUGH-HOLE CONNECTIONS

TECHNICAL FIELD

This application relates generally to improved processes of making printed circuits of the type wherein a conductive metal is sprayed through a mask or stencil to form "printed" circuit patterns on an insulating substrate. More specifically, certain features of the invention relate to improvements in the making of conductive "through holes" to connect a portion of a circuit deposited on one side of a planar substrate to a circuit on the opposite side, and to improved combination of materials for such circuits and for stencils used in the making of such circuits.

BACKGROUND OF THE INVENTION

In the past, it has been known to manufacture so-called "printed" circuits by various processes where droplets of conductive metal are sprayed onto an insulating substrate through a mask or stencil to define conductive patterns on the substrate, rather along the lines of a spray-painting technique. Two examples of such prior-known processes are disclosed in A. M. Hathaway U.S. Pat. No. 2,599,710 and T. E. Fairbairn U.S. Pat. No. 3,607,381 both herein incorporated by reference.

Various techniques and metal "flame-spraying" equipment have become available on the market, which render this basic process attractive for the mass production of very low-cost, relatively simple printed circuts, particularly for low-power, digital logic applications such as electronic keyboards for pushbutton telephone "dials," where the voltage and current requirements are low and where extremely fine control over electrical resistance of conductive patterns and extremely fine line widths, etc. are not required.

Specific objects of the present invention are to provide improvements in the prior-known flame-spraying process for making printed circuits of the type described above, particularly improvements with respect to combinations of materials for such circuits and the stencil, and to new and improved conductive through-hole constructions for two-sided circuit boards of this type.

More general objects are to provide improved low-cost printed circuit boards and manufacturing techniques, particularly for digital circuits, and particularly to provision of printed circuits and contact pads having excellent wear characteristics.

SUMMARY OF THE INVENTION

With the foregoing and other objects in view, the invention relates to improved processes of making printed circuit boards, of the type wherein conductive material, particularly metal, is sprayed through a stencil to form printed circuit patterns on one or more surfaces of an insulating substrate. In accordance with certain features of the invention, circuits are deposited on both sides of a planar substrate, preferably a molded thermoplastic substrate, and one or more through-hole connections are formed between selected portions of the circuit patterns on opposite sides of the substrate by forming at least one tapered hole through the substrate before spraying the patterns, and then spraying the patterns on opposite surfaces in such manner that a conductive through-hole connection is made via the tapered hole.

This is done by forming a frustoconical through hole, and first blocking the narrow end of the hole with a stop member, preferably having a polytetrafluoroethylene surface. A first metal circuit pattern is then sprayed onto a first surface of the substrate, the first surface being the one containing the wide end of the hole, so that a portion of the metal pattern coats the walls of the hole and forms a strip of the metal across the narrow end of the hole against the stop member. After this, the stop member is removed and a second metal circuit pattern is sprayed on the opposite surface of the substrate, so that a portion of the second pattern overlaps and makes electrical contact with the strip of metal previously formed across the narrow end of the hole. By these steps, a conductive through-hole connection is made between the first and second circuit patterns wherever desired.

The invention also relates to improved methods and combinations of materials for sprayed printed circuits of the type described above, particularly where the substrate is a thermoplastic material and the sprayed printed circuit conductive coating includes a primer coating of zinc, followed by a conductive layer of a higher-melting conductive metal, such as copper or nickel, deposited on the zinc coating.

The invention also concerns improved processes for making sprayed printed circuit patterns of the type described above, wherein a conductive metal coating is sprayed onto an insulating substrate through a chromium-plated metal stencil mechanically fastened to the surface of the substrate to be sprayed. Preferably, the stencil is sufficiently thin as to be flexible, such as five to eighteen mils in thickness (approximately 0.125 to 0.45 mm), and is made of a readily machinable metal such as brass, phosphor bronze, or steel.

Other objects, specific advantages, and features of the invention will be apparent from the following detailed description of specific examples and embodiments thereof, when read in conjunction with the accompanying drawings.

DETAILED DESCRIPTION

1. Introduction—General Principles

Figure 1:
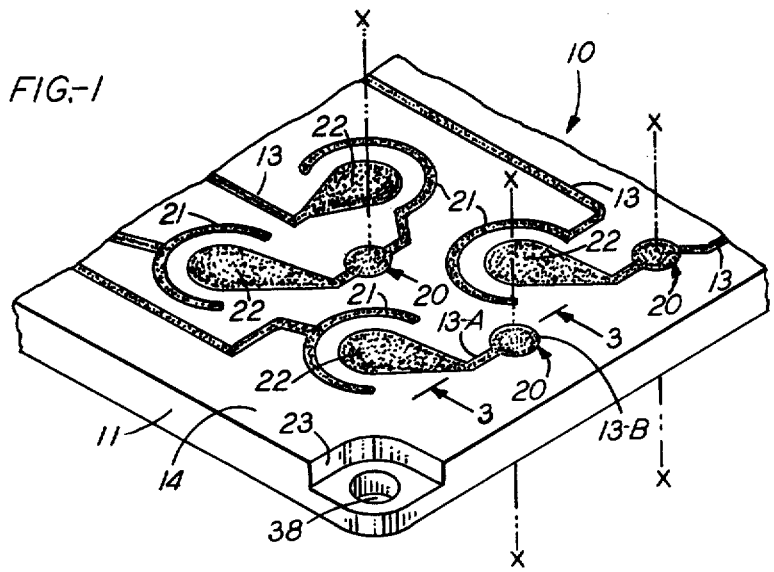
FIG. 1 is an enlarged, fragmentary perspective view illustrating a portion of a printed circuit pattern formed in accordance with a specific embodiment of the invention on one surface of a planar insulating substrate.
Figure 2:
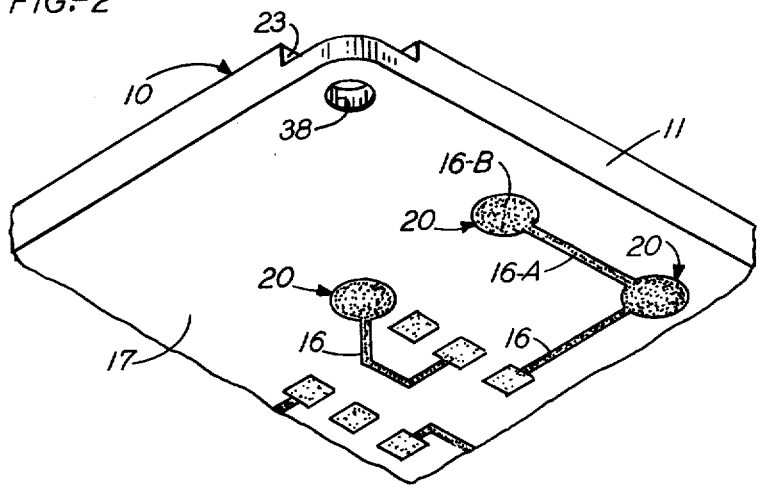
FIG. 2 is a perspective view similar to FIG. 1, illustrating a portion of a printed circuit pattern formed on the opposite surface of the substrate.
Figure 3:
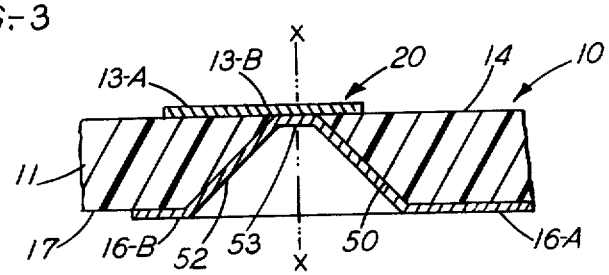
FIG. 3 is an enlarged vertical section through a portion of the circuit illustrated in FIG. 1, taken along line 3—3 of FIG. 1 and illustrating details of a conductive through-hole connection between the circuit pattern of FIGS. 1 and 2. Certain dimensions are exaggerated in FIG. 3 to illustrate principles.

Referring now in detail to the drawings, and particularly to FIGS. 1-3, there is illustrated portions of a typical printed circuit board 10 formed in accordance with one specific embodiment of the invention. The board 10 includes a planar insulating substrate 11, preferably of a thermoplastic material, having a circuit including "printed" circuit conductors 13—13 deposited on one surface 14 of the substrate 11 in a desired pattern as illustrated in FIG. 1. (The surface 14 is arbitrarily referred to hereafter as the "front" surface, for discussion purposes.)

A separate printed circuit, including conductors 16—16, is similarly deposited on the opposite or "rear" surface 17 of the substrate, as illustrated fragmentarily in FIG. 2. At selected regions of these circuits, such as are indicated by vertical axis lines X—X, it is desired to establish a "through-hole" electrical connection 20 (FIG. 3) between a portion (13-A) of the front circuit and a portion (16-A) of the rear circuit, as is generally well known in the art of making double-sided boards. In those regions, such as X—X, where through connects 20 are to be formed, enlarged land areas or pads, such as 13-B and 16-B, are customarily deposited on the surfaces of the substrate 11.

In the particular example illustrated, the circuit is designed for use as a switching matrix for an electronic keyboard or telephone pushbutton "dial" assembly, wherein the front surface 14 includes twelve printed "ring" 21 and "dot" 22 contact areas connected to selected ones of the conductors 13. A set of twelve flexible contact discs (not shown) is later assembled with the front surface 14 for selective operation by the individual pushbuttons or keys of the keyboard unit to make a bridging contact between a selected ring 21 and dot 22 when a key is depressed, as is well known in the keyboard art. Generally semicircular recesses 23 (FIG. 1) are formed at the corners of the board 10 along the front surface 14, and are used subsequently in assembling the contact discs with the board 10; however, these recesses 23 are not related to the practice of the present invention and will not be discussed further.

When a given ring 21 and dot 22 are connected by a contact disc, this energizes a selected operating circuit, such as a telephone signal tone generator, connected to the rear surface 17 of the board 10 via the adjacent through connects 20—20 and the rear surface printed-circuit conductors 16—16. In this example, all of the operating circuit components, such as integrated circuits, resistors, capacitors, etc. are later connected to the rear surface 17 of the board 10.

A principal object of this invention is to provide simple and low cost methods and materials for mass producing such relatively simple, two-sided printed circuits, particularly for low voltage, low current, digital logic and switching applications, wherein very low electrical resistivity is not required, nor are extremely fine line widths, or very tight tolerances.

Typical circuits of this type involve 40-50 mil line width (approximately 1 to 1.25 mm) conductors of metals such as copper and nickel, having a thickness of the order of two-three mils (0.05-0.075 mm), for telephone keyboard circuits involving typically a 48 volt D.C. power source and maximum current loads of the order of 100 milliamperes.

As discussed above, the prior-known metal spray techniques such as are generally disclosed for example in the Hathaway and Fairbairn patents are potentially very attractive for the fabrication of this type of printed circuit, and a principal specific object of this invention is to provide improvements in this general type of process and in the materials used, so to render such processes better suited for the low-cost manufacture of double-sided printed circuits such as illustrated in FIGS. 1-3, and to provide new and improved techniques for the making of through-hole connections such as 20.

Embodiments and Examples of the
Invention—Deposition of Circuit Patterns

In accordance with specific embodiments of this invention, the substrate 11 is formed of a molded thermoplastic material, such as "Ryton R-4," a polyphenylene sulfide material, marketed by Phillips Petroleum Company, Bartlesville, Oklahoma; or a polysulfone resin such as "Udel 1700," marketed by Union Carbide Corporation, New York, New York; or a glass-filled ABS resin (acrylonitrile-butadiene-styrene resin), such as "AB-1004," marketed by Liquid Nitrogen Processing Corporation, Malverne, Pennsylvania. Thermoplastics are preferred because of low cost, ease in fabrication by conventional plastics-molding techniques, including formation of alignment holes and through holes, and better sprayed-metal adhesion characteristics. Most preferred are mineral of glass-filled thermoplastics having a comparatively high heat deflection temperature, for example above 100° C., such as the three examples mentioned above.

Figure 4:
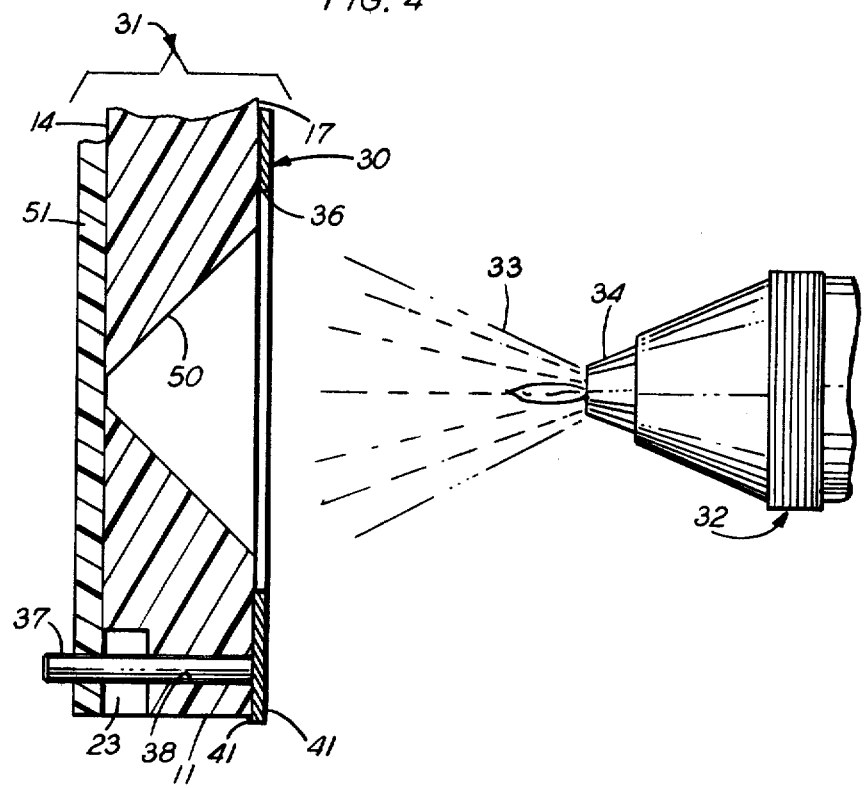
FIG. 4 is an enlarged fragmentary vertical section, with certain dimensions exaggerated, illustrating one step in a process of forming printed circuits of the type illustrated in FIGS. 1-3.

To apply the printed circuit conductors, the substrate 11 is assembled with a first stencil 30 in a fixture indicated schematically by the numeral 31, as generally illustrated in FIG. 4, for spray coating a first surface 14 or 17 with conductive patterns through the stencil using a generally conventional metal spray gun 32, preferably a flame-spray gun. In one typical example, the gun 32 is a Metco type 3K metalizing gun manufactured by Metco Inc. of Westbury, Long Island. This model employs an oxyacetylene torch to melt portions of a metal wire fed into the gun, and a compressed air stream to project an atomized spray 33 of metal droplets from a nozzle 34 toward the object (11) to be spray coated, as is generally well known in the flame-spraying art. Further details on the Metco flame spraying process and equipment may be obtained from the catalog "The Metco Flame Spraying Processes," copyright 1967 Metco Inc., herein incorporated by reference. For simplicity, low cost, ease of handling, and ability to use lower temperatures, the "Metalizing Process" described on pages 1-5 of the catalog is preferred; however, alternative processes such as the "Thermo Spray Process," pp. 7-10 of the catalog, or the "Plasma Flame Spray Process," pp. 11-12, could also be used.

Typical fixturing and handling equipment for the process is described in the catalog "Metco Flame Spray Handling Equipment," copyright 1978 Metco Inc., herein incorporated by reference.

Since these various metal spray techniques are well known in the art, they will not be described in detail herein. A simple oxyacetylene spray gun 32, as identified above, is preferred for the present application primarily because of low cost and ease of use with thermoplastic substrates of the type under consideration herein. Also, since the present invention preferably employs spraying metal directly onto thermoplastic substrates, there is no necessity for a plasma gun, with higher temperatures, as is required in some applications, such as where a ceramic insulating layer is deposited on a metal substrate. Also, the flame spray process works very well in the particular keyboard circuit shown in FIG. 1, wherein the front surface 14 is not entirely flat, being intentionally irregular with raised portions in the areas where the rings 21 and dots 22 are deposited, to provide good electrical contact and tactile feel when the contact pushbutton is depressed.

The stencil 30 is preferably made of a very thin compliant metal, such as brass, phosphor bronze or stainless steel, which may be easily machined or punched to form a mask or stencil 30 having openings or windows 36 conforming exactly to the conductive patterns, such as 16, to be deposited on the substrate 11. Preferably, the stencil 30 is formed from as thin a sheet as is practicable in practicing the process, preferably with a thickness of five to twenty mils (approximately 0.125 to 0.5 mm) and in a typical operating example seven mils (0.18 mm). This allows the stencil to be placed in tight-fitting engagement with the surface (17 or 14) of the substrate 11 to be sprayed, for formation of the patterns. Thin metal stencils are preferred because of low cost, ease of machining, and ease of cleaning for repeated use as discussed in further detail hereafter.

The stencil 30 is preferably formed with a set of four alignment pins 37 (one shown in FIG. 4) designed for reception in corresponding locating holes 38 (one shown in FIGS. 1, 2 and 4) formed through the substrate 11 at the four corners thereof, so as to permit precise alignment of the stencil 30 with the substrate 11 as shown in FIG. 4. In the embodiment illustrated in FIGS. 4-7, the stencil 30 and substrate 11 are aligned vertically in the fixture 31, and the spray gun 32 is traversed back and forth across the surface 17 to be sprayed, in conventional fashion and as described in the Metco catalogs, to deposit the desired circuit patterns through the windows 36 in the stencil 30. For high-volume production circuits, it may be preferable to mount the substrate 11-stencil 30 assembly on a conveyor and to traverse the assembly past banks of stationary nozzles, as is common in spray-painting operations.

In the specific application under consideration herein, it is desired to spray nickel circuit patterns (for corrosion resistance) such as 13, 21, 22 on the front surface 14 of the board 10 and to spray copper conductors 16 on the rear surface 17. In such a process, it has been found that relatively high-melting metal conductive patterns, such as copper or nickel, do not adhere well to thermoplastic substrates 11 of the type discussed above. The atomized metal droplets in the sprays 33 tend to bounce off the substrate surface when it is attempted to deposit them directly in such a flame-spray process.

It has been determined that metallic zinc will adhere well to such thermoplastics; thus, a thin primer coating 40 (FIG. 5) of metallic zinc is first applied to the substrate surface 17 or 14 through the stencil window 36. The zinc coating 40 may be an extremely thin flash coating, less than one mil (0.025 mm) in a typical example; but it should be thick enough to provide a complete coating without any bare spots or appreciable voids. There has been found to be no need for any special surface roughening or pretreatment of such thermoplastic substrates, other than normal cleaning, as with a freon or other dip commonly used to clean the plastic in question.

After the zinc coating 40 has been applied, the circuit patterns, such as copper or nickel, may then be sprayed onto the zinc coating 40 and will adhere readily to the zinc without further difficulties. Aluminum was also tried as the primer coating 40, but it did not work as well as zinc in the process.

Also, when using thin metal stencils, such as 30, of metals such as brass, phosphor bronze, or steel, it has been determined that the spray metals such as zinc, copper and nickel tend to adhere to the outer surface of the stencil, which makes repeated use of the stencil 30 a problem and requires frequent cleaning or treatment of the stencil, or unduly frequent replacement.

In accordance with certain features of this invention, it has been found that, if the metal stencil 30 is given an outer surface plating of chromium 41, the spray metals such as zinc, copper and nickel tend to bounce off the stencil surface 41 and not to adhere readily. Thus, a chrome-plated stencil 30 may be used repeatedly, such as ten to twelve times, with only infrequent cleaning. Preferably, the entire surface of the stencil 30 is chrome plated, including the inner surface adjacent to the substrate 11, which tends to accumulate a layer of "dirt" or thin deposit of particles from the flame-spray process. The chrome plated stencils may readily be cleaned for repeat use by dipping in a chromic acid solution, which returns the bright chrome surface.

Through-Hole Connections 20

In accordance with certain features of this invention, through-hole connections, such as 20, for two-sided, sprayed printed circuits of the type described are fabricated in a special manner. For this purpose, a set of tapered, preferably frustoconical holes 50 is formed through the substrate along those axes X—X (FIGS. 1-3) where through connects 20 are desired. Preferably, when using molded thermoplastic substrates 11, the holes 50 are formed during the molding process, but they could also be formed later by drilling or similar techniques where desired.

Figure 5:
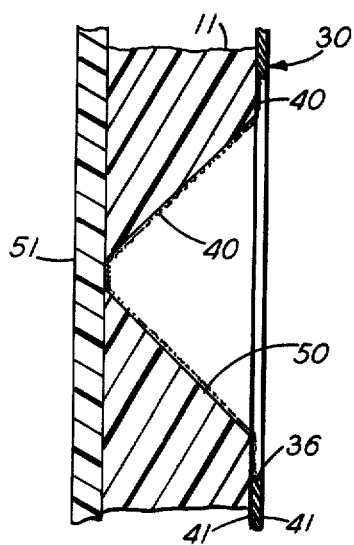
FIGS. 5, 6, 7 are fragmentary sectional views similar to FIG. 4, illustrating further steps in the process.
Figure 6:
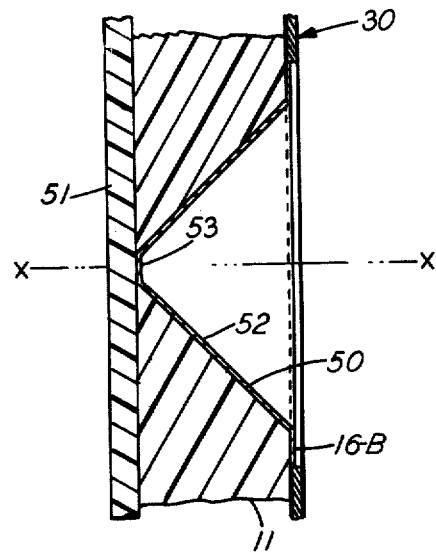

In this process, the printed-circuit pattern, such as 13 or 16, is first applied to that surface 14 or 17 of the substrate 11 which contains the wide end of each hole 50, as depicted in FIGS. 4-6. In the specific circuit board 10 under consideration herein, the wide ends of all of the holes 50 are formed facing what has previously been called the "rear" surface 17, which is to contain the operating printed circuits for the keyboard assembly. Obviously, this would vary from one circuit to another and, in some circuits, one might want some holes 50 facing in one direction and some facing the opposite direction as will appear from the following discussion.

Referring to FIGS. 4, 5 and 6, a removable stop member 51 is assembled with the substrate 11 and mask 30 prior to spraying the first circuit pattern (16 in this example). The stop member 51 fits tightly against the surface (14 in this example) of the substrate 11 opposite to the one (17) first to be sprayed so as to block the narrow end of each hole 50.

In the specific embodiment illustrated in FIGS. 4-6, the stop member 51 comprises a thin sheet of polytetrafluoroethylene; for example 20 mils (approximately ½ mm) in thickness. The sheet 31 is clamped tightly to the surface 14 so as to seal off the narrow end of each hole 50. Instead of a single sheet 51 for blocking all of the holes 50, a set of individual stop members or plugs may be used to block the individual holes 50, and this technique would be preferred for use with a conveyorized spraying system as mentioned earlier, in which the substrate 11 and stencil 30 would be mounted on a conveyor for traverse past fixed spray guns such as 32.

With this arrangment, when the zinc primer coating 40 (FIG. 5) is sprayed through the mask 30, it coats the tapered walls of the hole 50 and also forms a thin coating against the stop plate 51. Following this, when the metal circuit pattern 16, copper in this case, is sprayed through the mask 30 as illustrated in FIG. 6, it forms a portion 52 coating the tapered walls of the hole 50 and a bridging strip 53 across the narrow end of the hole 50 against the inner surface of the stop member 51.

Preferably, all of the rear-surface printed circuits 16—16, including the conductive pads such as 16-B (FIG. 2) and the in-hole plated regions 52-53 are all formed in a single spray coating step, so as to form a continuous conductive coating 16, 16-B, 52, 53 of copper on the zinc primer coat 40, extending into and through the hole 50 from the wide end as illustrated in FIG. 6. With this technique, it should be noted that there are no sharp corners or right-angle bends in the printed-circuit pattern 16, 16-B, 52, 53 deposited on the first or rear surface 17 of the substrate 11 at the region of the through hole connection 20 to be formed about the axis X—X.

For some circuits of this type, as is generally known, it is desirable to add a solder coating, such as 70% tin-30% zinc, to cover some or all of the conductors. In this process, the solder coating can easily be applied after the copper coating using the same spray-coating equipment with a solder wire fed to the spray gun 32. Where a coextensive solder coat is desired, the same stencil 30 may be used; otherwise a new stencil is used where a different solder pattern is desired.

Figure 7:
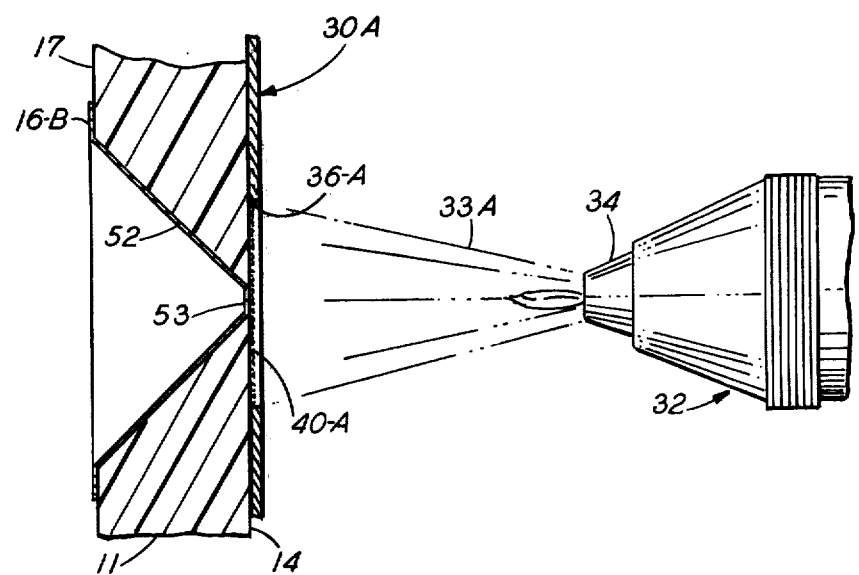

After this first spraying step has been completed, the first stencil 30 is removed and the stop member 51 is peeled from the front surface 14 so as to leave the partially formed circuit board 10 with the rear-side printed circuit pattern 16 deposited in place, as shown in FIGS. 2, 3, and 7.

Preferably, the stop plate 51, sheet or plug, is made of a plastic material, such as polytetrafluoroethylene, to which the sprayed metals, zinc and copper in this case, will adhere so as to permit formation of the bridging strip 53 across the narrow end of the hole. But, preferably, the adhesion strength of the strip 53 to the material of the stop plate 51 should be relatively low, less than that between the strip 53 and the adjacent portions 52 along the walls of the hole 50, so that the stop member 51 may thus be disengaged from the substrate 11 without tearing off the bridging section 53 of the circuit. In addition to the nature of the stop material, these characteristics of removability of the stop also depend to some extent on the size and shape of the hole 50. Preferably, the narrow end of the hole 50 has a width of 10–30 mils (0.25 to 0.75 mm), 20 mils in a specific working example, and the taper of the hole walls is preferably approximately 45°. It is believed that minimum hole diameters smaller than 10 mils would be quite operable but, for economy reasons, when using molded substrates 11, the minimum size is limited to about 10 mils in view of the molding process and the sizes of hole-forming pins that can readily be used in such a process. Too large a hole would waste copper, and would also increase the likelihood that portions of the coating 52-53 in the hole 50 might be ripped away with the stop member 51.

In the example of FIG. 4–7, after the stop member 51 and first mask 30 have been removed, the substrate 11 is turned around and reassembled in the fixture 31 with a second mask 30-A as shown in FIG. 7. The mask 30-A has windows 36-A patterned to form the second or front side printed circuit elements 13, 21, 22 in the same manner previously described with respect to forming the rear-side circuits. First, a microlayer of zinc 40-A is deposited on the front surface 14 through the windows 36-A, after which a spray 33-A, of metallic nickel in this example, is deposited on the zinc coating 40-A to form the conductors 13, 21, 22, and pad areas such as 13-B in FIGS. 1 and 3. As illustrated in FIG. 3, the pads such as 13-B cover the outer surface of the strips 53 of metal at the narrow ends of the holes 50 so as to make electrical contact therewith, thus completing the through hole connections 20 by making reliable metal-to-metal contact.

From the foregoing description, it should be apparent that there has been provided a simple and effective technique of making through-hole connections 20 for sprayed metal printed circuits, so as to adapt such processes to the manufacture of low cost, two-sided circuit boards 10. Also, there has been provided improved methods and materials for simply and effectively spraying conductive metals, such as copper or nickel, directly onto thermoplastic substrates using a primer coating such as zinc, and using a chrome-plated metal mask. While the specific embodiments of the invention employ nickel and copper as the conductive metals for the conductive patterns, it is apparent that various other higher-melting conductive metals (that is, higher melting than zinc (419° C.) could be used, such as silver.

Circuit conductors flame-sprayed in accordance with the invention also have excellent wear characteristics, giving long life, which is particularly important for contact pads such as the rings 21 and dots 22 comprising switch contact areas and subject to mechanical wear.

While various specific examples and embodiments of the invention have been described in detail hereinabove, it should be obvious that various modifications may be made from the specific details, steps and materials described, without departing from the spirit and scope of the invention.

What is claimed is:

1. An improved process of making a printed circuit board, of the type wherein a conductive material is sprayed through a stencil to form a printed circuit pattern on a surface of an insulating substrate, wherein the improvement comprises:
    forming at least one frustoconical hole through the substrate;
    blocking the narrow end of the hole with a removable stop member;
    then spraying a first circuit pattern on a first surface of the substrate, the first surface being that containing the wide end of the hole, so that a portion of the pattern coats the walls of the hole and forms a strip of the material across the narrow end of the hole against the stop member;
    next, removing the stop member; and then
    spraying a second circuit pattern on the opposite side of the substrate so that a portion of the second pattern overlaps and makes electrical contact with the strip of material formed across the narrow end of the hole in the prior spraying step, whereby a conductive through-hole connection is made between the first circuit pattern and the second pattern via the tapered hole.

2. A process as recited in claim 1, wherein the conductive patterns comprise first a primer coating of zinc, followed by a conductive layer of a higher-melting conductive metal or metals deposited on the zinc coating.

3. A process as recited in claim 2, wherein the substrate is a thermoplastic material and the higher-melting metal is copper or nickel.

4. A process as recited in claim 1, wherein the coatings are flame sprayed onto the substrate through a stencil having a chromium surface and mechanically fastened to the surface of the substrate to be sprayed.

5. A process as recited in claim 4, wherein the stencil comprises a chromium-plated metal stencil.

6. A process as recited in claim 5, wherein the stencil has a thickness of five to twenty mils.

7. A process as recited in claim 6, wherein the stencil is made of chrome-plated brass, phosphor bronze, or steel.

8. An improved process of making a printed circuit board, of the type wherein conductive metal is sprayed through a stencil to form a printed-circuit pattern on a surface of a planar insulating substrate, wherein the improvement comprises:

(a) forming a plurality of frustoconical holes through a molded thermoplastic substrate at locations where through connects are desired between circuits to be formed on opposite surfaces of the substrate;

(b) blocking the narrow end of each hole with a removable stop member, (c) flame spraying a first metal circuit pattern on a first surface of the substrate, the first surface being that containing the wide end of each hole, so that a portion of the metal pattern coats the walls of each hole and forms a strip of the metal across the narrow end of each hole against the stop member;

(d) removing the stop member after step (c); and (e) flame spraying a second metal circuit pattern on the opposite surface of the substrate so that a portion of the second pattern overlaps and makes electrical contact with the strip of metal formed across the narrow end of each hole in step (c), whereby a conductive through-hole connection is made between the first circuit pattern and the second pattern via each through hole.

9. A process as recited in claim 8, wherein the conductive coating comprises first a primer coating of zinc, followed by an outer conductive layer of copper or nickel flame sprayed onto the zinc coating.

10. A process as recited in claim 8 or claim 9, wherein the stop member has a polytetrafluoroethylene surface at the region blocking each through hole.

* * * * *